(12) United States Patent
Orui et al.

(10) Patent No.: US 7,053,315 B2
(45) Date of Patent: May 30, 2006

(54) JUNCTION STRUCTURE AND JUNCTION METHOD FOR CONDUCTIVE PROJECTION

(75) Inventors: Ken Orui, Kanagawaa (JP); Hiroko Jinno, Kanagawa (JP); Yuji Nishitani, Kanagawa (JP); Hiroshi Asami, Shizuoka (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/802,188

(22) Filed: Mar. 17, 2004

(65) Prior Publication Data

US 2005/0056445 A1  Mar. 17, 2005

(30) Foreign Application Priority Data

Mar. 20, 2003  (JP) ............................ P2003-077343

(51) Int. Cl.
*H05K 1/11* (2006.01)
*H01R 12/04* (2006.01)

(52) U.S. Cl. ....................... 174/267; 174/260; 257/778; 29/842

(58) Field of Classification Search ................ 174/267, 174/260, 261; 361/760; 257/778, 737, 738; 29/842
See application file for complete search history.

(56) References Cited

U.S. PATENT DOCUMENTS

| | | | | |
|---|---|---|---|---|
| 5,869,904 A | * | 2/1999 | Shoji ........................... | 257/779 |
| 6,559,390 B1 | * | 5/2003 | Tanaka ........................ | 174/260 |
| 6,696,644 B1 | * | 2/2004 | Chiu et al. .................. | 174/52.2 |
| 6,799,711 B1 | * | 10/2004 | Kurata et al. ............... | 228/56.3 |
| 6,924,553 B1 | * | 8/2005 | Ohara ......................... | 257/738 |

\* cited by examiner

*Primary Examiner*—Ishwar I.B. Patel
(74) *Attorney, Agent, or Firm*—Sonnenschein, Nath & Rosenthal LLP

(57) ABSTRACT

To provide a junction structure and a junction method for conductive projection advantageous in that a required reinforcement strength can be obtained while suppressing the amount of a reinforcing resin material supplied to prevent warpage due to curing shrinkage. A conductive projection is joined to the surface of a conductor portion formed at the same level as that of the surface of the insulating layer so that a root portion of the projection is surrounded by a fillet-form resin material. The resin material contains an activator which assists in the junction between the conductive projection and the conductor portion when the resin material is in an uncured state, and is fused by heating to wet and rise the root portion of the conductive projection so as to be in a fillet form. The resin material is cured by an ultraviolet light while excluding the resin material on the conductor portion.

6 Claims, 12 Drawing Sheets

EXAMPLE 1

COMPARATIVE EXAMPLE 1

COMPARATIVE EXAMPLE 1

COMPARATIVE EXAMPLE 2

COMPARATIVE EXAMPLE 3

JUNCTION STRUCTURE AND JUNCTION METHOD FOR CONDUCTIVE PROJECTION

CROSS REFERENCE TO RELATED APPLICATIONS

The present document is based on Japanese Priority Document JP2003-077343, filed in the Japanese Patent Office on Mar. 20, 2003, the entire contents of which being incorporated herein by reference.

BACKGROUND OF THE INVENTION

1. Field of the Invention

The present invention relates to a junction structure and a junction method of conductive projection used for making electrical and mechanical connection when mounting, for example, semiconductor parts on a wiring board, such as a mother board. More particularly, the present invention is related to a junction structure of conductive projection, which is joined to a planarized surface having no steps by surrounding its root portion with a resin material in a ring form to have high junction strength, and to a junction method of the conductive projection.

2. Description of Related Art

In recent years, as electronic apparatuses are being further miniaturized and sophisticated, there are increasing demands for semiconductor parts to be mounted that should be more sophisticated and be even thinner, so that the semiconductor parts tend to have more and more pins. For meeting the demands, when rearrangement of chip electrode portions on an interposer is conducted without changing the wiring rule, the number of layers in the interposer is increased, causing a problem of an increase in the thickness of a package. Therefore, an interposer at a high wiring density which meets the demands of the increase of pins without sacrificing reduction of the thickness of the package is desired.

The increase of pins causes a bare chip to be larger, thus increasing the size of a package having the bare chip mounted. In accordance with this tendency, higher junction reliability is required in the junction between the package and the mother board.

In view of the above, for example, Patent document 1 has proposed a structure in which the root portion of the conductive projection joined onto an interposer is surrounded by a resin material to reinforce there.

[Patent Document 1]
  Japanese Patent No. 2842361

SUMMARY OF THE INVENTION

When a periphery of the root portion of the conductive projection is reinforced by a resin material, it is important that the reinforcing resin material is supplied uniformly to the periphery of the root portion of each conductive projection. In Patent document 1, as shown in FIG. 12, there is a step between the surface of an insulating layer 11 and a conductor portion 12. For this reason, when applying the reinforcing resin material to the root portion of the conductive projection, the resin material is disadvantageously supplied along the steps, so that the amount of the resin material supplied is not uniform and a fillet 46 at a certain position cannot have a satisfactory height, leading to a disadvantage in that the junction strength may be lowered.

When the amount of the resin material supplied is increased for obtaining a desired fillet height or preventing the fillet from having an ununiform height, shrinkage on curing of the increased resin material causes strain in the interposer, so that a problem in that the semiconductor package suffers warpage is likely to occur. This is remarkable especially in the thinner interposer.

As a method for avoiding the warpage, there is a method in which the reinforcing resin material is supplied by a screen printing process only to the conductor portion to which the conductive projection is joined, but this method has a problem in that printing is difficult when the pitches between the conductive projections are narrower.

In view of the above, there are needs for providing a junction structure and a junction method for conductive projection by which a required reinforcement strength may be obtained while suppressing the amount of a reinforcing resin material supplied to prevent the occurrence of warpage due to the shrinkage on curing of the resin material.

For addressing the above needs, the junction structure for conductive projection of the present invention has a characteristic feature such that the conductive projection is joined to the surface of the conductor portion which is formed at the same level as that of the surface of the insulating layer so that a root portion of the conductive projection is surrounded by a resin material in a ring form.

When the surface of the conductor portion is formed at the same level as that of the surface of the insulating layer and there are no steps on the surface, the resin material is prevented from flowing into a gap. Further, even when the amount of the resin material supplied is small, a larger amount of the resin material may be allowed to wet and rise the root portion of the conductive projection, thereby enabling reinforcement by the resin material having a uniform height required for securing a satisfactory strength of the junction portion.

The reinforcing resin material does not cover the entire portion of the conductive projection but surrounds the root portion of the conductive projection so as to be in a ring form. Therefore, if failure or defect is detected after the junction is made, such conductive projection may be repaired. The fused resin material is likely to wet the root portion of the conductive projection so as to be in a fillet form. The resin material in a fillet form is a resin material having a form such that its thickness gradually decreases in a direction from the root portion to the top end portion of the conductive projection. When the conductive projection is reinforced by the resin material in a fillet form, a thermal stress exerted on the conductive projection is not concentrated on a single point but dispersed, thus obtaining high junction reliability. The resin material in a fillet form can be easily realized by means of a heating reflow apparatus under conditions for heating conventionally generally used.

When the resin material contains an activator which assists in the junction between the conductive projection and the conductor portion when the resin material is in an uncured state, not only reinforcement of the junction portion but also cleaning or an improvement of the junction plane in wettability can be achieved due to the action of the activator without applying a flux separately. As the activator used in the present invention, one having a property such that it loses its action after the curing reaction of the resin material is completed is used. Therefore, the activator does not lower the insulation reliability without cleaning as conducted for a flux generally used.

By using a resin material having photo-curing properties, when the resin material is selectively cured by a light, the resin material can serve as a solder resist for covering and protecting the conductor portion other than the junction plane. By this method, there is no need to preliminarily form a solder resist. Further, before the heating step for the junction, the resin material is cured by a light, excluding the resin material on the junction plane, the conductive projection can be prevented from suffering mispositioning or aggregation during the heating step.

When the conductive projection has a core portion encapsulated therein, a stress exerted on the junction portion of the conductive projection may be relaxed by using a material having elasticity, e.g., a resin for the core portion.

The junction method for conductive projection of the present invention includes the steps of: forming a conductor portion on an insulating layer in such a way that the surface of the conductor portion is formed at the same level as that of the surface of the insulating layer; supplying a resin material in an uncured state onto at least a junction plane of the conductor portion to which a conductive projection is joined; disposing the conductive projection on the junction plane which has the resin material supplied thereon; and heating the resin material and the conductive projection to join the conductive projection to the conductor portion while curing the resin material so that a root portion of the conductive projection is surrounded by the resin material in a ring form.

In this method, the steps on the surface to which the conductive projection is joined are removed and then the reinforcing resin material is supplied to the resultant flat surface. Therefore, even if the amount of the resin material supplied is small, since the resin material is prevented from flowing into gaps on the surface, a larger amount of the resin material can be allowed to wet and rise the root portion of the conductive projection, thus making it possible to form the resin material having a uniform height required for securing a satisfactory strength of the junction portion.

As examples of methods for making the surface of the conductor portion formed at the same level as that of the surface of the insulating layer, there can be mentioned a method in which an insulating layer for planarization is supplied to the surface in a state such that the conductor portion is formed on the insulating layer, followed by polishing, and a method in which planarization is made by filling portions between the conductor portions with an insulating layer and the resultant material is formed on a transfer support, and bonded and transferred to the insulating layer to which the conductive projection is joined.

The resin material is first supplied and then the conductive projection is disposed on and joined to the conductor portion, and hence the resin material is not deposited on the upper end portion side of the conductive projection, and therefore connection of the structure to another wiring board, such as a mother board, can be advantageously accomplished.

The resin material is supplied to at least the conductor portion which is the junction plane for the conductive projection, but the junction method may be carried out such that the resin material in an uncured state is supplied onto the entire surfaces of both of the conductor portion and the insulating layer, and cured by exposure, excluding the resin material on the junction plane, and then the conductive projection is disposed on the junction plane on which the resin material remains uncured, followed by heating the resin material and the conductive projection.

By this method, the portion of the resin material cured by exposure as such can serve as a solder resist for covering and protecting the conductor portion other than the junction plane for the conductive projection. Further, the portion of the resin material cured by exposure controls the movement of the conductive projection during the heating step or the like, making it possible to prevent the conductive projection from suffering mispositioning or aggregation.

By the present invention, the conductive projection is joined to the surface of the conductor portion which is formed at the same level as that of the surface of the insulating layer so that the root portion of the conductive projection is surrounded by the resin material in a ring form. Therefore, even when the amount of the resin material supplied is reduced for suppressing warpage, a fillet having a large height can be obtained to improve the junction portion in strength and reliability, as compared to that in a structure without planarization. Accordingly, high wiring density can be achieved by reducing the size of the conductive projection without increasing the number of layers of interconnection to cause the substrate to have a large thickness.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DESCRIPTION OF THE PREFERRED EMBODIMENTS

Hereinbelow, preferred embodiments of the present invention will be described with reference to the drawings.

First Embodiment

In the present embodiment, as one example of the junction structure and junction method of the present invention, a structure in which a conductive projection is joined to an interposer, on which conductor portions (wiring and land) are formed for rearrangement of electrode portions of a semiconductor bare chip to be mounted is formed to a larger pitch, so that a root portion of the conductive projection is reinforced by a resin, and a junction method for the structure will be described. FIGS. 1 to 4 illustrate process steps for the junction.

Figure 1A:
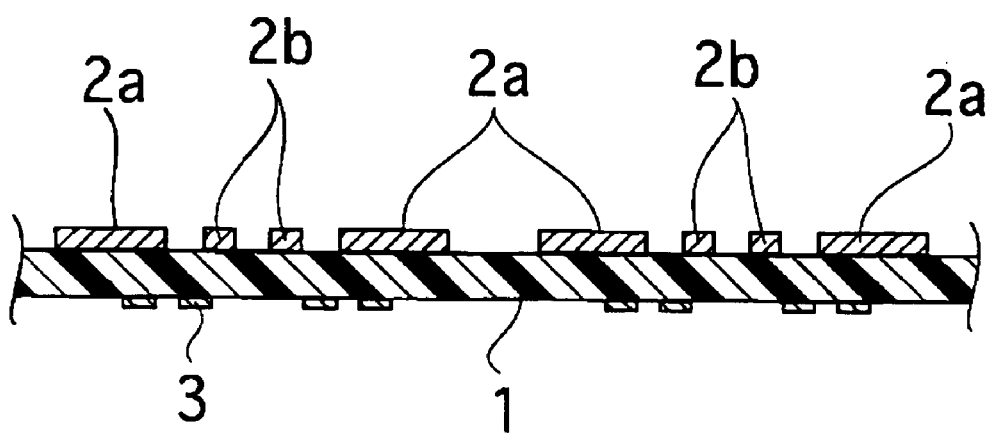
FIGS. 1A and 1B are diagrammatic cross-sectional views illustrating steps in a junction method for conductive projection according to a first embodiment of the present invention.

Process Step of FIG. 1A

First, a substrate including an insulating layer 1 having formed on both surfaces thereof conductor portions 2a, 2b, 3 is prepared or provided. For example, the conductor portions 2a, 2b, 3 are formed in a desired pattern on the insulating layer 1 by a subtractive method in which a flat metal foil is bonded onto the insulating layer 1 and then an unnecessary portion of the metal foil is etched, or an additive method in which the insulating layer 1 is subjected to pattern plating by electroless plating or electrolytic plating. The surface of the conductor portion 2a is a junction plane to which the below-described conductive projection is joined.

With respect to the materials for the insulating layer 1 and conductor portions 2a, 2b, 3, there is no particular limitation, and they are appropriately selected depending on the properties required. As the insulating layer 1, for example, glass fiber impregnated with an epoxy resin, glass fiber impregnated with a polyimide resin, or paper impregnated with a phenolic resin may be used. Alternatively, a mixture of an epoxy resin and a bismaleimidetriazine resin, a liquid crystallinepolymer, benzocyclobutene, or the like may be used. As a material for the conductor portions 2a, 2b, 3, generally, copper is often used, but other metals may be used as long as they satisfy a required electrical resistance value.

A not shown step of forming a connection hole for connecting the conductor portions 2a, 2b formed on one surface of the insulating layer 1 to the conductor portion 3 formed on another surface and forming a conductive material for filling the hole is conducted to make interlayer connection between the conductor portions 2a, 2b and the conductor portion 3.

Figure 1B:
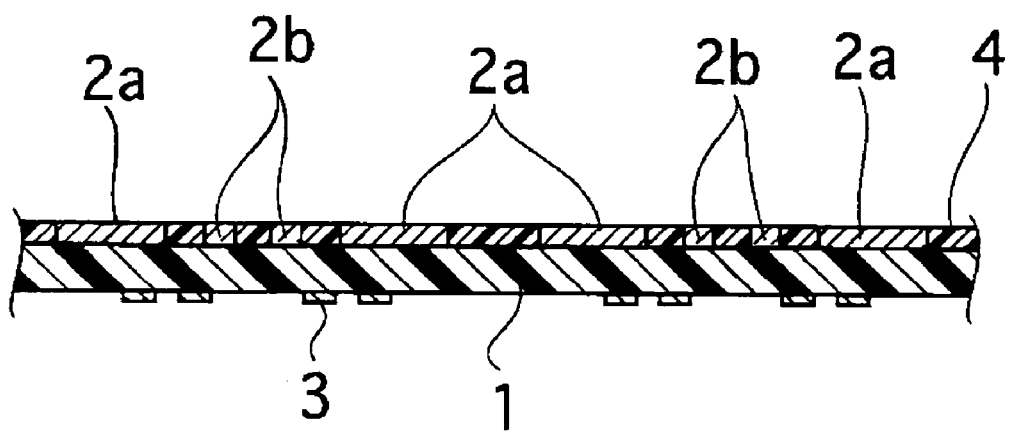

Process Step of FIG. 1B

One surface of the substrate on which the conductor portions 2a, 2b are formed is subjected to planarization. For example, first, a resin material in a paste state is applied to the one surface of the substrate so as to fill portions between the conductor portions 2a, 2b. Subsequently, the resin material is cured by heating or the like, and then polished so that the surfaces of the conductor portions 2a, 2b are exposed. Thus, an insulating layer 4 is formed on the insulating layer 1 by filling portions between the conductor portions 2a, 2b and the surface of the insulating layer 4 is formed at the same level as those of the surfaces of the conductor portions 2a, 2b, thereby achieving planarization of the surface of the substrate to which a conductive projection is joined.

Figure 2A:
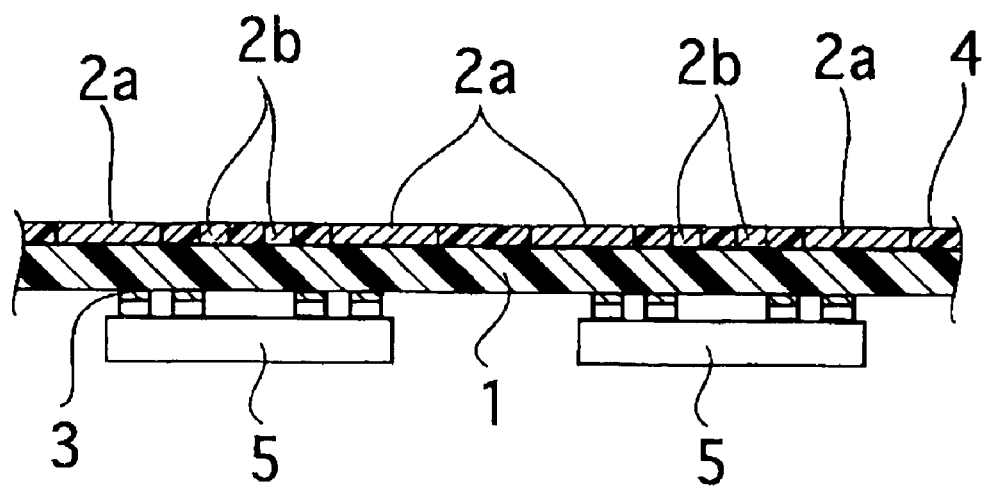
FIGS. 2A and 2B are diagrammatic cross-sectional views illustrating steps subsequent to the step of FIG. 1B.

Process Step of FIG. 2A

For example, a semiconductor bare chip 5 is mounted by electrically connecting it to the conductor portion 3 formed on another surface of the insulating layer 1. In the connection between the semiconductor bare chip 5 and the conductor portion 3, for example, Au—Au junction, Au—Sn junction, Au—SnAg junction, or Sn—Ni junction is used. As examples of methods for forming a metal layer for junction on the semiconductor bare chip 5, there can be mentioned a stud bump process and a plating bump process. On the other hand, the conductor portion 3 may be subjected to surface treatment by, for example, a plating process to form a desired metal layer for junction on the conductor portion 3. When Ni is used as the metal layer for junction, Au or Pd may be plated in a small thickness (about several tens nm) on the surface of the Ni layer to prevent oxidation.

For securing the mounting reliability of the semiconductor bare chip 5, a gap between the semiconductor bare chip 5 and the surface of the insulating layer 1 on which the semiconductor bare chip 5 is mounted may be filled with an underfill resin material. The filling with the resin material may be conducted either before or after the mounting of the semiconductor bare chip 5.

Figure 2B:
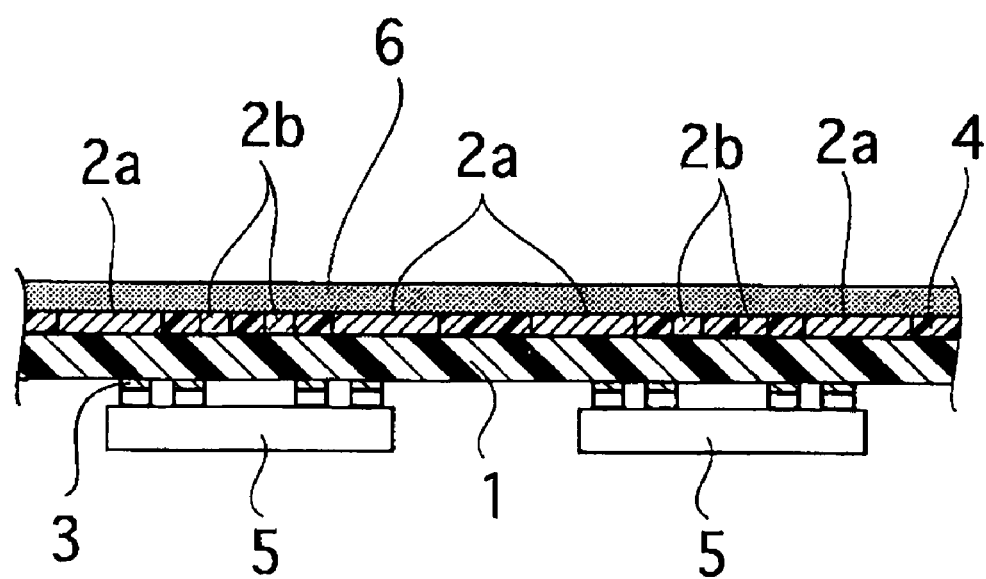

Process Step of FIG. 2B

A resin material 6 is supplied to the entire surfaces of all of the insulating layer 4 and the conductor portions 2a, 2b after the planarization. As examples of methods for supplying the resin material 6, there can be mentioned a method in which a resin material diluted with a solvent to be in a liquid state is applied by a spraying process and then dried, a method in which a resin material in a paste state is supplied by a printing or spin coating process, and a method in which a resin material in a film form, which is not completely cured, for example, in a B-stage, is bonded to the surface, but the method is not particularly limited to these methods as long as a required amount of the resin material can be uniformly supplied. The required amount means an amount such that the below-described fillet has a height required for securing a satisfactory junction strength.

In the present embodiment, the resin material 6, for example, having ultraviolet curing properties and containing an activator is used. Specifically, the resin material 6 obtained by incorporating into a phenolic novolak containing at least an acryloyl group or a methacryloyl group a resin which serves as a curing agent for the phenolic novolak and a photopolymerization initiator is used. The phenolic hydroxyl group of the phenolic novolak functions as an activator, and removes contaminants, such as an oxide, from the surface of solder and a metal or prevents reoxidation due to its reducing action, thus improving the wettability of the solder or fused metal with respect to the surface of the conductor portion 2a which is the junction plane. The activator loses this action after the resin material 6 is cured.

As the curing agent, an epoxy resin, an isocyanate resin, or the like is used. Specific examples include epoxy compounds and is ocyanate compounds, each obtained by modifying a phenolic base compound, such as bisphenol, phenolic novolak, alkylphenolic novolak, biphenol, naphthol, or resorcinol, or an aliphatic, alicyclic, or unsaturated aliphatic base compound.

Examples of photopolymerization initiators include benzophenones, such as benzophenone, benzoylbenzoic acid, 4-phenylbenzophenone, and hydroxybenzophenone; benzoinalkyl ethers, such as benzoin, benzoinmethyl ether, benzoindimethyl ether, benzoin ethyl ether, benzoin isopropyl ether, benzoin butyl ether, and benzoin isobutyl ether;

acetophenones, such as 4-phenoxydichloroacetophenone, 4-t-butyl-dichloroacetophenone, 4-t-butyl-trichloroacetophenone, and diethoxyacetophenone; thioxanthones, such as thioxanthone, 2-chlorothioxanthone, 2-methylthioxanthone, and 2,4-dimethylthioxanthone; and alkylanthraquinones, such as ethylanthraquinone and butylanthraquinone. These initiators may be used individually or in the form of a mixture of two or more initiators.

Figure 3A:
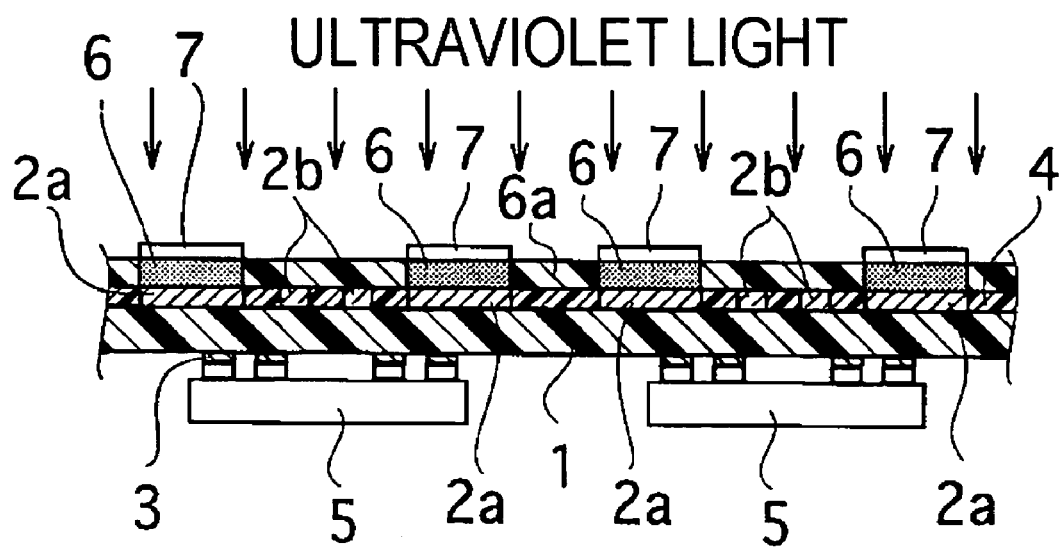
FIGS. 3A and 3B are diagrammatic cross-sectional views illustrating steps subsequent to the step of FIG. 2B.

Process Step of FIG. 3A

On a portion of the resin material 6 over the conductor portion 2a which is the junction plane for a conductive projection 8, a resist mask 7 is formed by conventionally known photolithography and etching. The other portions of the resin material 6 are exposed, and irradiated with an ultraviolet light in this state.

Thus, a resin material 6a at a portion which is not covered with the resist mask 7 is cured. The resin material 6a serves as an insulating protective film (solder resist) for preventing an occurrence of short-circuiting between the conductor portions 2b, between the conductor portions 2a, 2b, or between the conductor portion 2b and the conductive projection 8. Therefore, there is no need to form a solder resist separately, enabling the process step to be simplified.

Figure 3B:
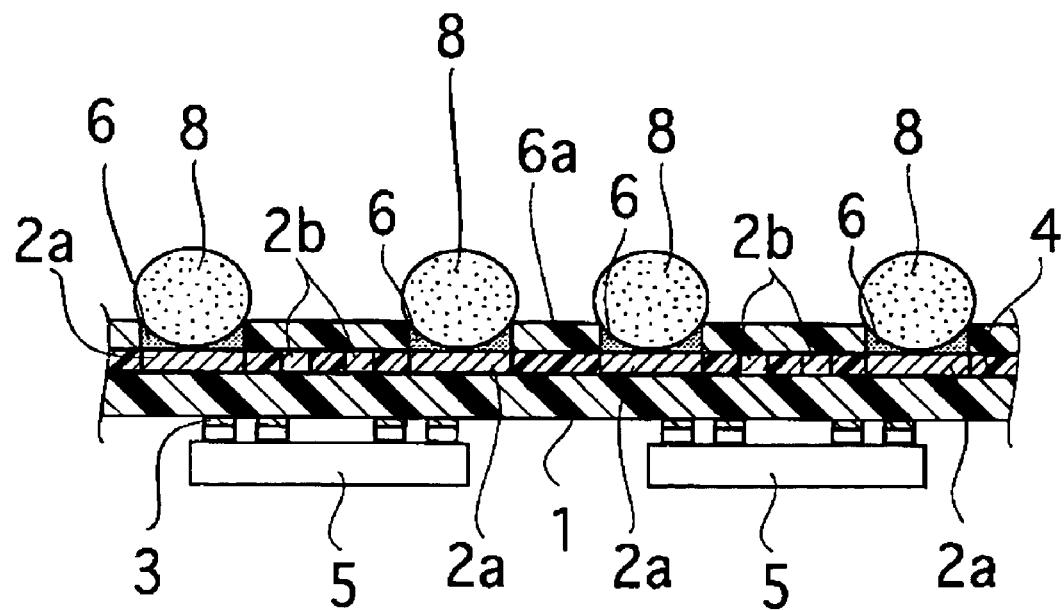

Process Step of FIG. 3B

After removing the resist mask 7, a spherical conductive projection 8 is disposed on the surface of the conductor portion 2a on which the resin material 6 remains uncured. With respect to the material for the conductive projection 8, there is no particular limitation, and a material having a conventionally known alloy composition, such as Sn—Pb, Sn—Ag, Sn—Ag—Cu, Sn—Zn, or Sn—Zn—Bi, is used.

Figure 15:
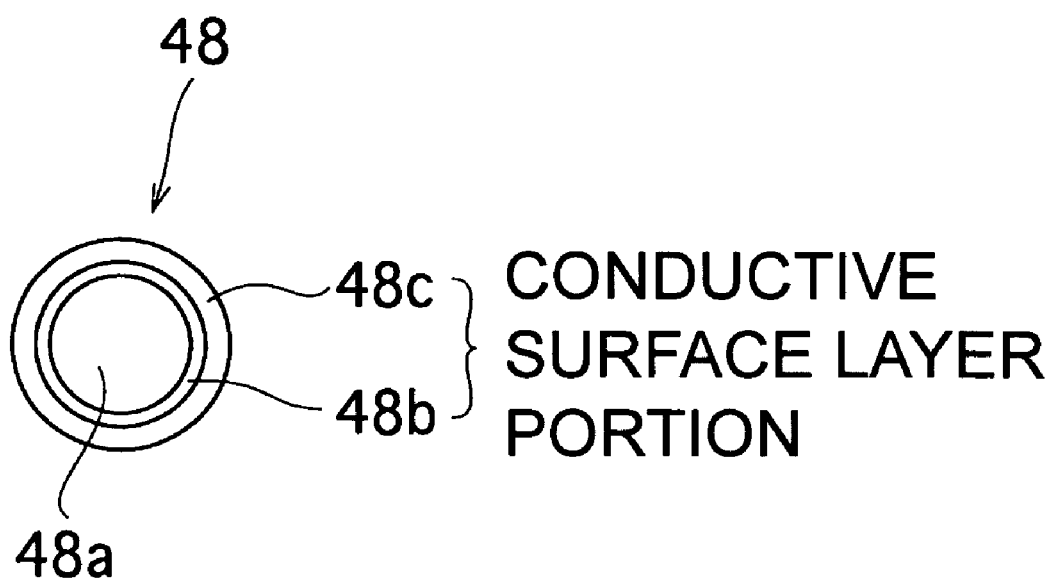
FIG. 15 is a diagrammatic cross-sectional view of a conductive projection having one example of structure.

Alternatively, a conductive projection 48 shown in FIG. 15 having encapsulated therein a core portion 48a comprised of, e.g., a resin material may be used. The surface of the core portion 48a is coated with a conductive surface layer portion which includes a metal layer 48b and a solder plated layer 48c. By virtue of having the core portion 48a encapsulated, the whole of the conductive projection receives an external stress, thus relaxing a stress at the junction portion. In addition, the gap between an interposer and a mother board which are connected together through the conductive projection 48 is kept uniform, realizing high junction reliability. The core portion 48a may be comprised of any material as long as it has stress relaxation properties and consistent diameter, and the material is not limited to a resin but may be a rubber or a metal.

Figure 4A:
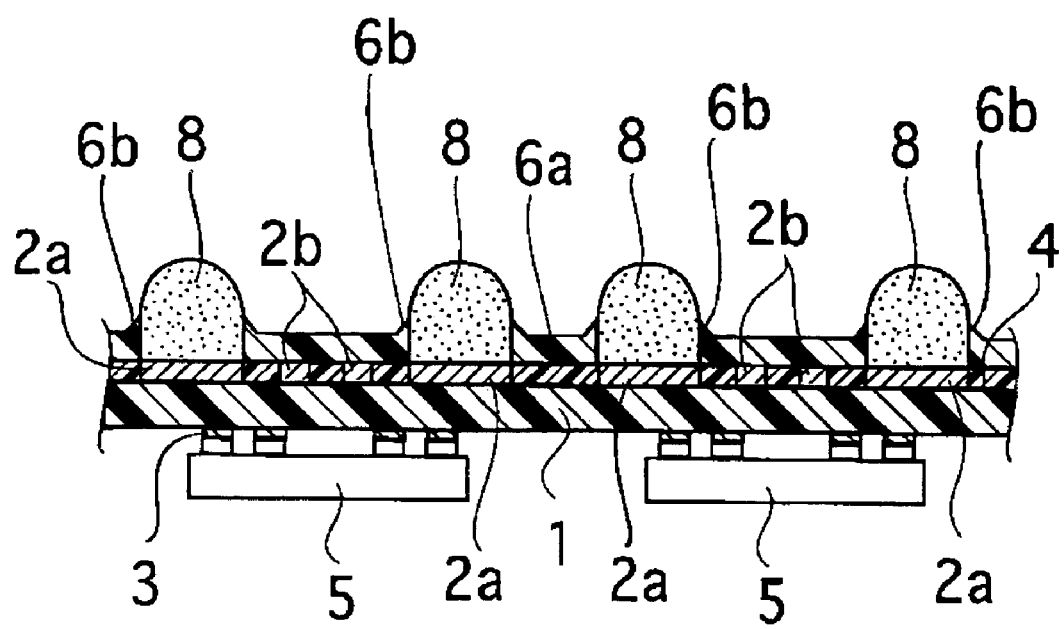
FIGS. 4A and 4B are diagrammatic cross-sectional views illustrating steps subsequent to the step of FIG. 3B.

Process Step of FIG. 4A

This is a process step for placing the interposer having mounted the reon the conductive projection 8 in are flow process furnace to heat it. The conductive projection 8 disposed on the conductor portion 2a is brought by gravity into contact with the surface of the conductor portion 2a, and fused by further heating, and the fused conductive projection 8 wets and spreads the surface of the conductor portion 2a so as to push away the uncured resin material 6, thus achieving metal junction between the conductive projection 8 and the conductor portion 2a.

The resin material 6 at a portion on which the conductive projection 8 is disposed is uncured upon reflow and hence has a metal activating action due to the included activator described above, and therefore the wettability between the conductive projection 8 and the conductor portion 2a can be improved without applying a flux separately, thus enabling a high level of junction strength.

Further, the heating in this instance allows the uncured resin material 6 to wet the root portion (portion on the side of the junction portion to the conductor portion 2a) of the conductive projection 8 and spread in a ring form to form a fillet 6b surrounding the root portion, and cured by further heating.

The insulating layer 4 fills the portions between the conductor portions 2a, 2b and the surface to which the conductive projection 8 is joined is flat by planarization, and therefore the uncured resin material 6 is prevented from flowing into the portions between the conductor portions 2a, 2b when forming the fillet 6b, thus making it possible to increase the amount of the resin material which wets and spreads the root portion of the conductive projection 8.

Accordingly, a fillet having a large height can be obtained, as compared to a conventional fillet formed when there is a step between the junction plane and the surface of the insulating layer and no planarization is conducted (when the amount of the reinforcing resin material supplied is the same), and thus the junction strength of the conductive projection 8 can be improved.

The resin material 6 having photo-curing properties and containing an activator cannot contain filler in a large amount and is likely to suffer relatively large shrinkage on curing due to its properties. Therefore, for suppressing warpage of the interposer or semiconductor bare chip 5, it is advantageous that the amount of the resin material 6 supplied is as small as possible. In the present embodiment, as mentioned above, the surface to which the resin material 6 is supplied is flat by planarization, and hence the resin material 6 supplied even in a small amount can realize a fillet height required for securing a satisfactory strength. The fillet height required for securing a satisfactory strength varies depending on the type of the resin material or the material for or size of the conductive projection 8, but a satisfactory fillet height may be, for example, 10 percent of the height of the conductive projection 8 or more.

In the resin material (e.g., epoxy resin) 4 used for planarization, filler (e.g., powder of silicate) maybe added to optimize physical properties, such as a coefficient of thermal expansion, of the resin material, making,it possible to lower the shrinkage on curing and suppress warpage of the interposer or semiconductor bare chip 5.

In addition, when the resin material 6 is supplied onto a flat surface, the thickness of the resin material 6 supplied on the surface can be uniform, thus making it possible to form the fillet 6b having a consistent height. Therefore, a difference in the junction strength between the conductive projections 8 disposed at different positions is suppressed, preventing a stress from locally concentrating on the conductive projection 8 having a small junction strength.

Further, when the resin material 6a being present between the conductive projections 8 and protecting the conductor portions 2b is cured by exposure before fusing the conductive projections 8 by heating, the conductive projections 8 can be prevented from undergoing aggregation during the fusing by heating. In other words, the resin material 6a cured by exposure has also a function of positioning the individual conductive projections 8 at the corresponding conductor portions 2a and joining them together.

Figure 4B:
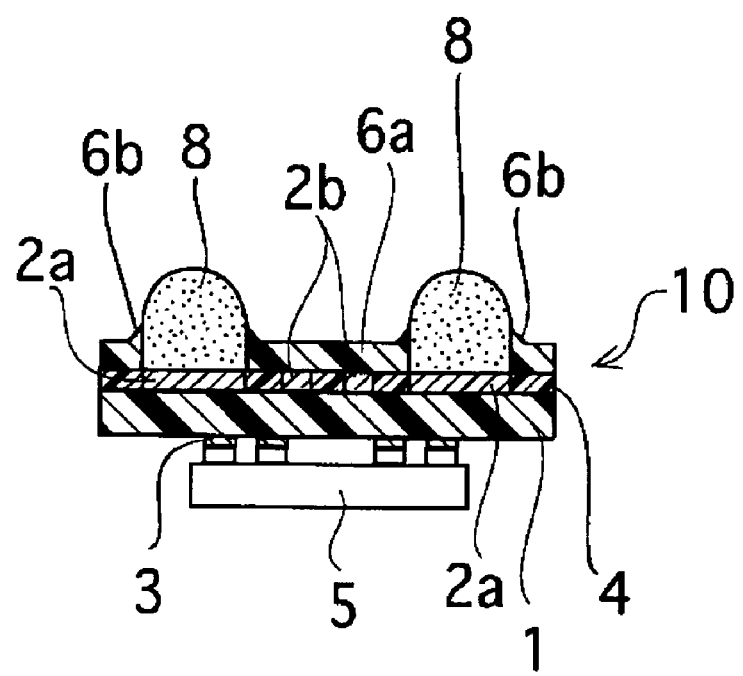

Finally, a dicing treatment is performed, thus obtaining a semiconductor part in which, as shown in FIG. 4B, the conductive projection 8 which serves as an external connection terminal is joined to the surface of the conductor portion 2a which is formed at the same level as that of the surface of the insulating layer 4 so that the root portion of the conductive projection 8 is surrounded by the fillet 6b comprised of a resin material. By employing this junction structure, there can be obtained a structure such that the amount of the reinforcing resin material 6 can be reduced for suppressing warpage while maintaining the fillet height required for securing a desired strength. This junction structure is effective especially for junction of the conductive projection 8 which tends to become smaller for meeting the demands of reduction in thickness and increase in pins.

Second Embodiment

Next, the second embodiment of the present invention will be described. In the first and second embodiments, like constituent parts or portions are indicated by like reference numerals, and the overlapping detailed description is omitted.

In the first embodiment, as the resin material 6 for reinforcing the junction portion, an ultraviolet-curing resin material is mentioned as an example, but, when forming the fillet 6b around the root portion of the conductive projection 8, the resin material does not necessarily have ultraviolet curing properties.

Figure 7A:
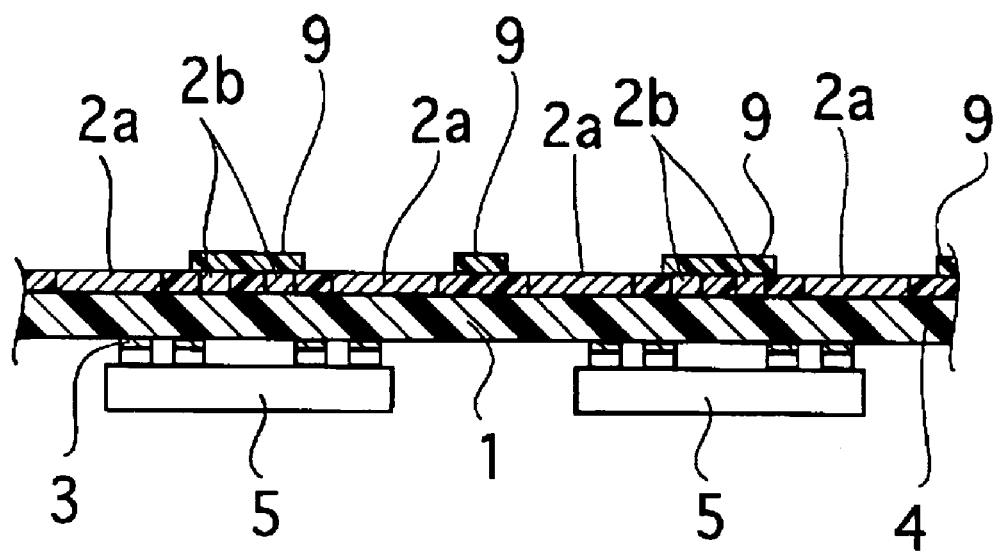
FIGS. 7A and 7B are diagrammatic cross-sectional views illustrating steps in a junction method for conductive projection according to a second embodiment.

In this case, the resin material 6 does not serve as a solder resist for protecting the conductor portion 2b and hence, as shown in FIG. 7A, there is a need to form a solder resist 9 for covering the conductor portion 2b on the surface of the insulating layer 4 which has preliminarily been subjected to planarization.

Figure 7B:
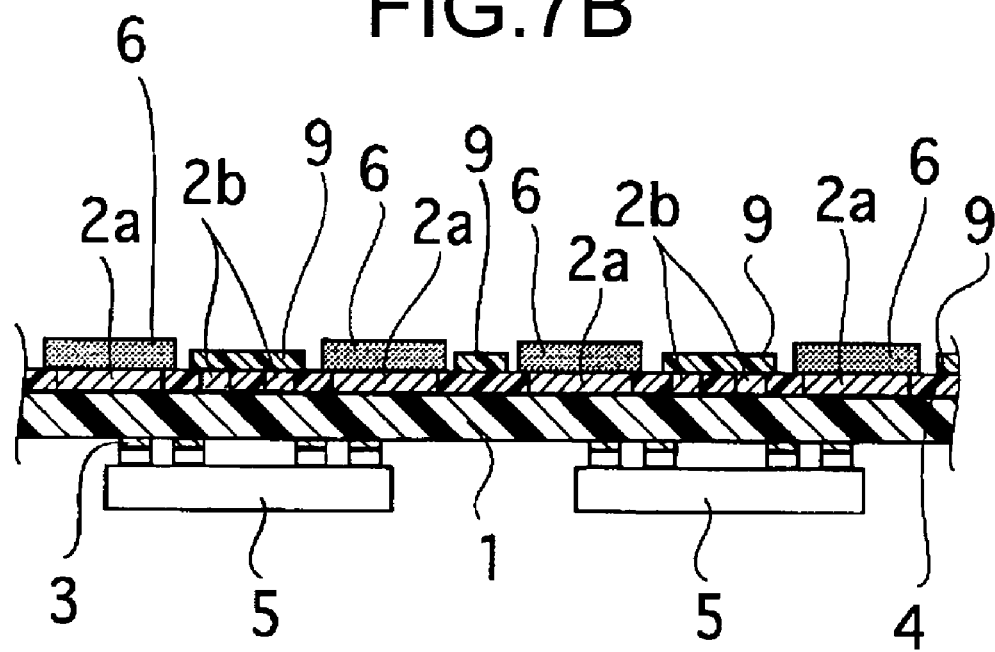

Then, as shown in FIG. 7B, the resin material 6 in a paste state is supplied by a printing process only to the conductor portion 2a and its periphery portion.

Figure 8A:
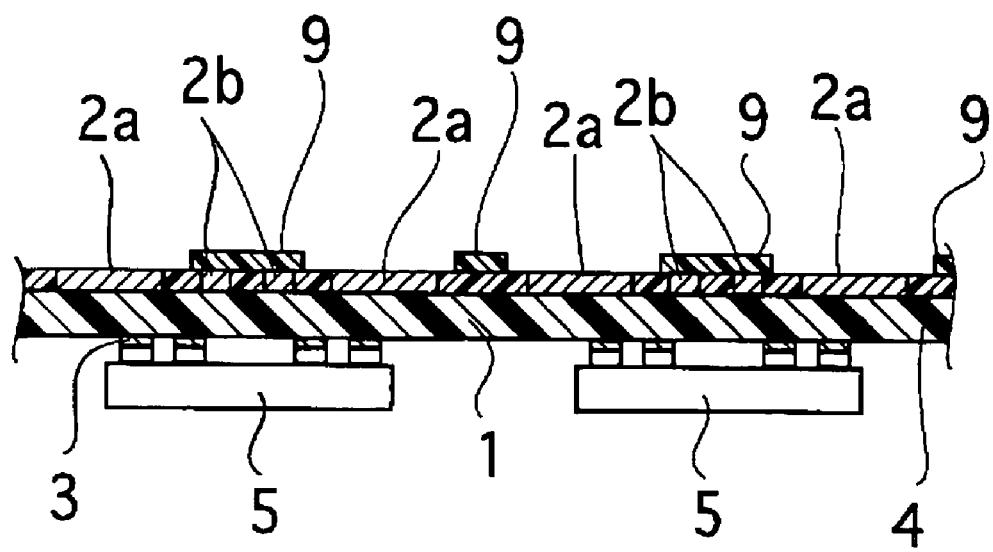
FIGS. 8A and 8B are diagrammatic cross-sectional views illustrating steps subsequent to the step of FIG. 7B.
Figure 8B:
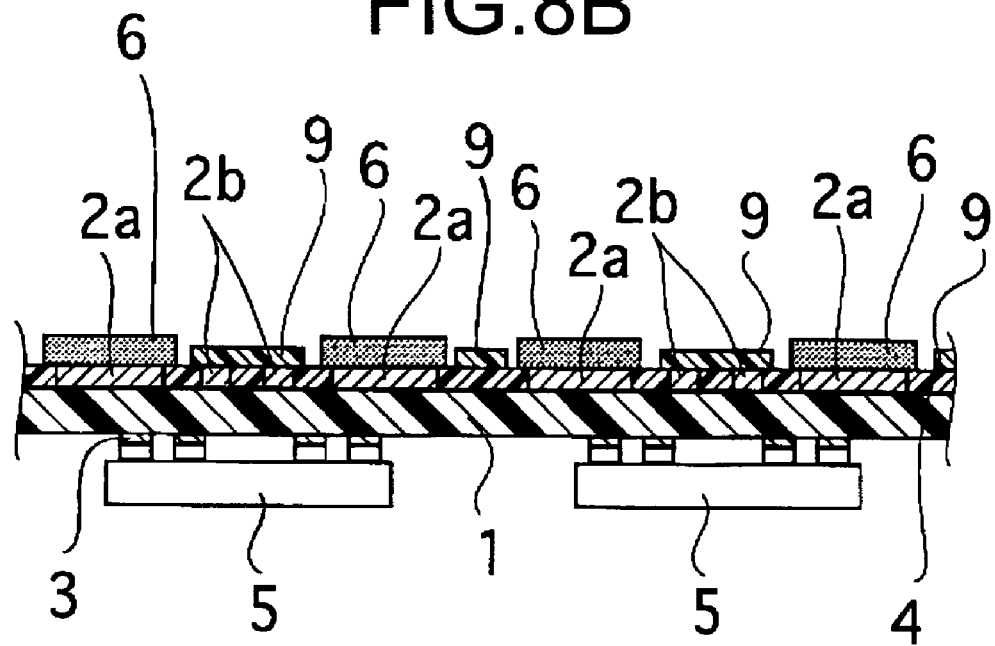

Then, without the step for ultraviolet light irradiation as conducted in the first embodiment, as shown in FIG. 8A, the conductive projection 8 is disposed on the resin material 6 and conductor portion 2a, and subjected to reflow heating in the same manner as in the first embodiment to join together the conductive projection 8 and the conductor portion 2a and allow the resin material 6 to wet and rise the root portion of the conductive projection 8, thus forming a fillet 6b surrounding the root portion, followed by curing by further heating (FIG. 8B).

In the present embodiment, the insulating layer 4 fills the portions between the conductor portions 2a, 2b and the surface to which the conductive projection 8 is joined is flat by planarization, and therefore the uncured resin material 6 is prevented from flowing into the portions between the conductor portions 2a, 2b when forming the fillet 6b, thus making it possible to increase the amount of the resin material which wets and spreads the root portion of the conductive projection 8. Substantially the same effect as that obtained in the first embodiment can be obtained except that the resin material 6 does not serve as a solder resist.

Next, the results of measurement of a shear strength in Example 1 employing the junction structure and junction method similar to those in the second embodiment are shown while comparing with the results in Comparative Examples 1 to 3 corresponding to prior art techniques.

STRUCTURE OF EXAMPLE 1

Figure 5:
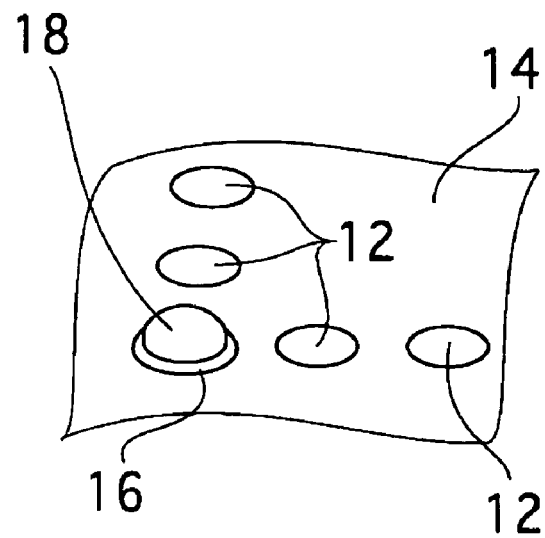
FIG. 5 is an enlarged perspective view of a junction portion of a conductive projection in Example 1.

FIG. 5 is a perspective view of an essential portion of a substrate for evaluation in Example 1. A printed wiring board including a base material 14 having a 30 mm×30 mm size, having 12 points of copper lands (conductor portions) 12 each having a diameter of 300 μm, and having 12 points of copper lands (conductor portions) 12 each having a diameter of 200 μm was prepared, and this printed wiring board was used as a substrate for evaluation. As the base material, glass fiber impregnated with an epoxy resin (grade FR-4) was polished. The base material has a thickness of 0.4 mm, and each conductor portion 12 has a thickness of 18 μm.

An insulating layer 14 comprised of an epoxy resin was applied to the evaluation substrate so that the thickness of the layer became 20 μm, and cured to cover the conductor portions 12 and fill portions between the conductor portions 12. Subsequently, the cured insulating layer 14 was abraded so that the surfaces of the conductor portions 12 were exposed, thus achieving a planarization treatment for the evaluation substrate.

Subsequently, an epoxy resin material having thermosetting properties and containing a metal activator was supplied by a printing process using a screen mask having an opening diameter of 300 μm and a thickness of 60 μm only onto the conductor portions 12 of the evaluation substrate which had been subjected to planarization treatment, and solder balls (Sn63Pb37 composition) 18 each having a diameter of 300 μm were mounted as conductive projections on the resin material.

Then, reflow heating at a peak temperature of 220° C. was conducted to join the solder ball 18 to the conductor portion 12. Further, heating at 150° C. was conducted for 1 hour to completely cure the resin material containing a metal activator.

Thus, a structure shown in FIG. 5 was obtained in which the root portion of the solder ball 18 was surrounded by the resin material 16 in a fillet form.

Subsequently, a shear strength of the solder ball 18 was measured. The shear strength at the conductor portions 12 having a diameter of 300 μm was 0.58×9.80665 (N) (average value of 12 points), and the shear strength at the conductor portions 12 having a diameter of 200 μm was 0.49×9.80665 (N)(average value of 12 points).

STRUCTURE OF COMPARATIVE EXAMPLE 1

Figure 6:
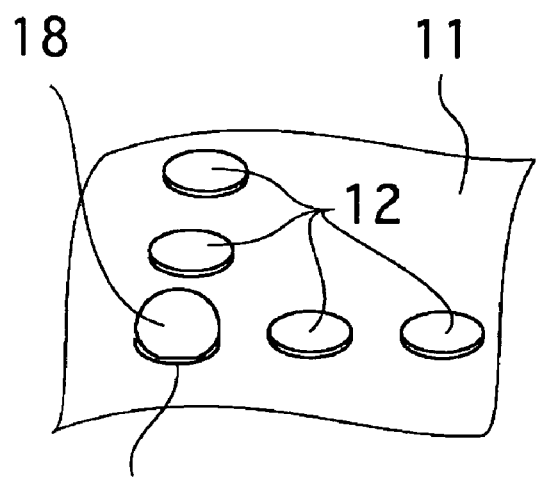
FIG. 6 is an enlarged perspective view of a junction portion of a conductive projection in Comparative Example 1.
Figure 12:
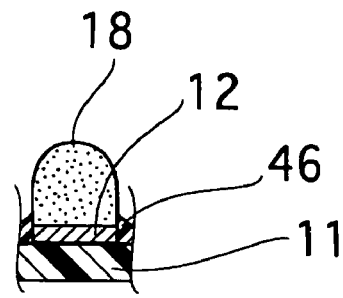
FIG. 12 is an enlarged cross-sectional view of a junction portion of a conductive projection in Comparative Example 1.

Substantially the same procedure as in Example 1 was repeated except that no planarization treatment for the evaluation substrate was conducted to form solder balls 18. The form of the resin material reinforcing the solder ball 18 is shown in FIG. 6 and FIG. 12. The root portion of the solder ball 18 was surrounded by the resin material 46 like in Example 1, but the surface to which the reinforcing resin material was supplied was not subjected to planarization treatment, and hence the resin material supplied disadvantageously flowed into the gaps between the conductor portions 12. Therefore, although the amount of the resin material printed was the same, the height of the resin material 46 was only about ½ to ⅓ of that in Example 1.

Subsequently, a shear strength of the solder ball 18 in Comparative Example 1 was measured. The shear strength at the conductor portions 12 having a diameter of 300 μm was 0.45×9.80665 (N) (average value of 12 points), and the shear strength at the conductor portions 12 having a diameter of 200 μm was 0.38×9.80665 (N) (average value of 12 points).

STRUCTURE OF COMPARATIVE EXAMPLE 2

Figure 13:
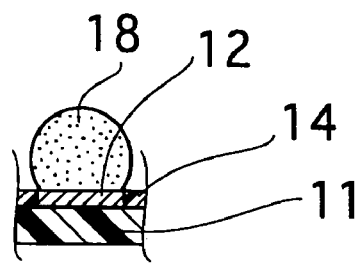
FIG. 13 is an enlarged cross-sectional view of a junction portion of a conductive projection in Comparative Example 2.

Substantially the same procedure as in Example 1 was repeated except that, instead of the resin material containing a metal activator, a general flux (BF-31; manufactured and sold by TAMURA KAKEN Corporation) was used for junction to form solder balls 18. The junction structure obtained is shown in FIG. 13. The reinforcement structure by the resin material seen in Example 1 and Comparative Example 1 was not observed around the root portion of the solder ball 18.

Subsequently, a shear strength of the solder ball 18 in Comparative Example 2 was measured. The shear strength at the conductor portions 12 having a diameter of 300 μm was 0.43×9.80665 (N) (average value of 12 points), and the shear strength at the conductor portions 12 having a diameter of 200 μm was 0.26×9.80665 (N) (average value of 12 points)

STRUCTURE OF COMPARATIVE EXAMPLE 3

Figure 14:
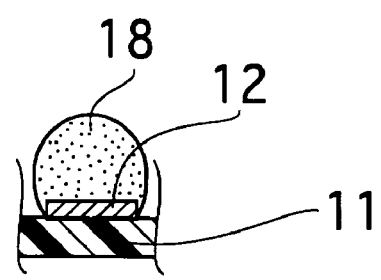
FIG. 14 is an enlarged cross-sectional view of a junction portion of a conductive projection in Comparative Example 3.

Substantially the same procedure as in Example 1 was repeated except that, instead of the resin material containing a metal activator, a general flux (BF-31; manufactured and sold by TAMURA KAKEN Corporation) was used, and that no planarization treatment for the evaluation substrate was conducted to form solder balls 18. The junction structure obtained is shown in FIG. 14. The reinforcement structure by the resin material seen in Example 1 and Comparative Example 1 was not observed around the root portion of the solder ball 18.

Subsequently, a shear strength of the solder ball 18 in Comparative Example 3 was measured. The shear strength at the conductor portions 12 having a diameter of 300 μm was 0.43×9.80665 (N) (average value of 12 points), and the shear strength at the conductor portions 12 having a diameter of 200 μm was 0.25×9.80665 (N) (average value of 12 points)

The results of measurement of the shear strength are shown in Table 1.

TABLE 1

| Shear strength of conductive projection | | |
|---|---|---|
| Land diameter | 300 μm | 200 μm |
| Example 1 | 0.58 | 0.49 |
| Comparative Example 1 | 0.45 | 0.38 |
| Comparative Example 2 | 0.43 | 0.26 |
| Comparative Example 3 | 0.43 | 0.25 |
| | {×9.80665 (N)} | |

As apparent from Table 1, a structure in which the root portion of the solder ball 18 is surrounded and reinforced by the resin material on the evaluation substrate which has been subjected to planarization, namely, the junction structure in Example 1 exhibits the highest shear strength with respect to each of the conductor portions having a diameter of 300 μm and the conductor portions having a diameter of 200 μm. Particularly, the shear strength at the conductor portions having a diameter of 200 μm in Example 1 is higher than the shear strength of the structure in Comparative Example 3 at the conductor portions having a diameter of 300 μm conventionally generally used, which indicates that the junction structure in Example 1 using the junction structure of the present invention can be advantageously put into practical use even when the diameter of the conductor portions is 200 μm.

If some rosin flux generally used remains due to a lack of cleaning, a structure such that the remaining flux covers the periphery of a conductive projection is possibly obtained, but this structure is too brittle to serve as a reinforcing material for the junction portion.

Third Embodiment

The junction structure and junction method for conductive projection of the present invention can be applied not only to an interposer but also to a so-called wafer level chip size package (CSP) which performs rewiring or formation of conductive projection collectively in the form of a wafer.

Figure 9A:
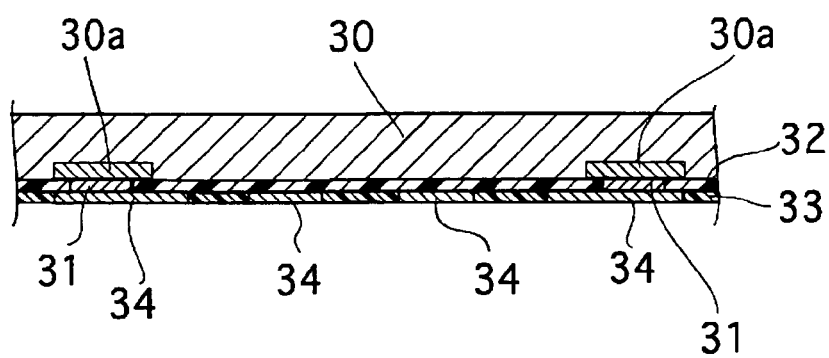
FIGS. 9A and 9B are diagrammatic cross-sectional views illustrating steps in a junction method for conductive projection according to a third embodiment.

Specifically, in FIG. 9A, a plurality of micro-electrode portions 30a for semiconductor integrated circuit formed on the surface of a semiconductor wafer 30 comprised of silicon or the like are rearranged through conductor portions 31 formed by opening an insulating protective film 32 to conductor portions 34 which are connected to the conductor portions 31 and which have a pitch further enlarged.

Portions between the conductor portions 34 are filled with an insulating layer 33 by a method similar to the method described above with reference to FIG. 1B, so that the surface of the conductor portion 34 is formed at the same level as that of the surface of the insulating layer 33.

Figure 9B:
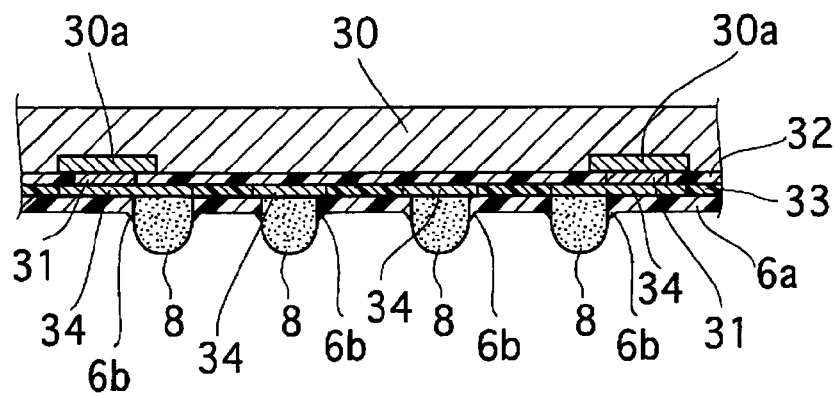

Then, on the flat surface by planarization, a structure shown in FIG. 9B, in which a conductive projection 8 is joined to the conductor portion 34 so that the root portion of the conductive projection 8 is surrounded and reinforced by a fillet 6b, is obtained through steps similar to the above steps shown in FIGS. 2B to 4A.

In the present embodiment, the same effect as that obtained in the first embodiment can be obtained, but, in the wafer level CSP which is largely affected by a stress caused due to a difference in the coefficient of thermal expansion between the wafer 30 comprised of silicon or the like and the mother board comprised of a resin material or the like, the conductive projection 8 is required to have a higher junction strength, and, for the reason that reduction of the size of the conductive projection 8 for increasing the wiring density can be conducted in a smaller cost than the cost for further increasing the number of the layers of interconnection, the above-described structure using planarization and reinforcement by a resin material in combination is especially effective.

Hereinabove, the preferred embodiments of the present invention are described, but the present invention is not limited to these and can be changed or modified based on the technical concept of the present invention.

Figure 10A:
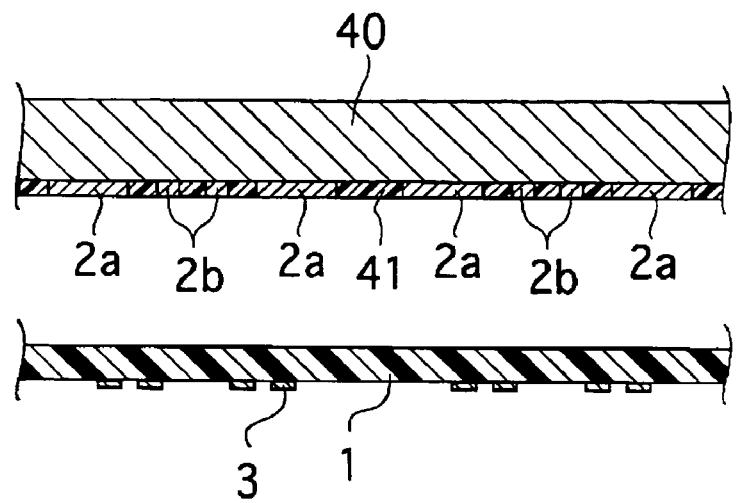
FIGS. 10A to 10C are diagrammatic cross-sectional views illustrating steps for planarization of a surface of a substrate in a modified example.
Figure 10B:
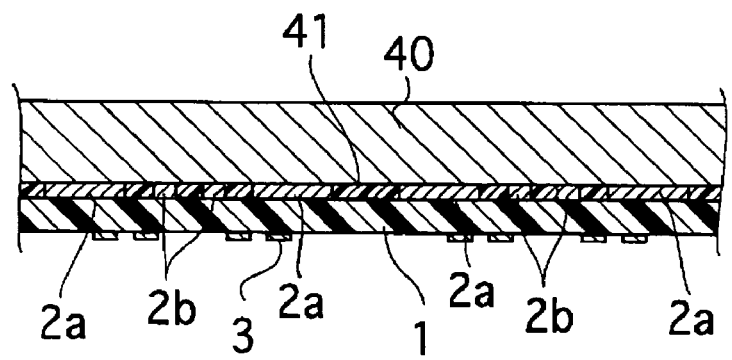
Figure 10C:
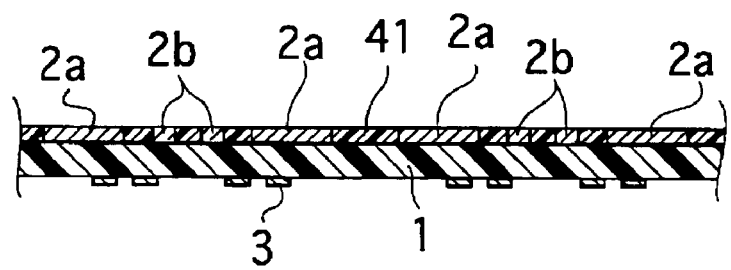

In the first embodiment, the planarization treatment is performed in such a state that the conductor portions 2a, 2b are preliminarily formed on the insulating layer 1, but, for example, when, as shown in FIG. 10A, the conductor portions 2a, 2b are formed on the surface of a support 40 comprised of a metal through a release layer (not shown) and subjected to planarization treatment using an insulating layer 41, and the resultant material is bonded to the insulating layer 1 (FIG. 10B) and then the support 40 is peeled off, the formation of the conductor portions 2a, 2b on the insulating layer 1 and the planarization treatment for the insulating layer 1 can be achieved simultaneously (FIG. 10C).

Figure 11A:
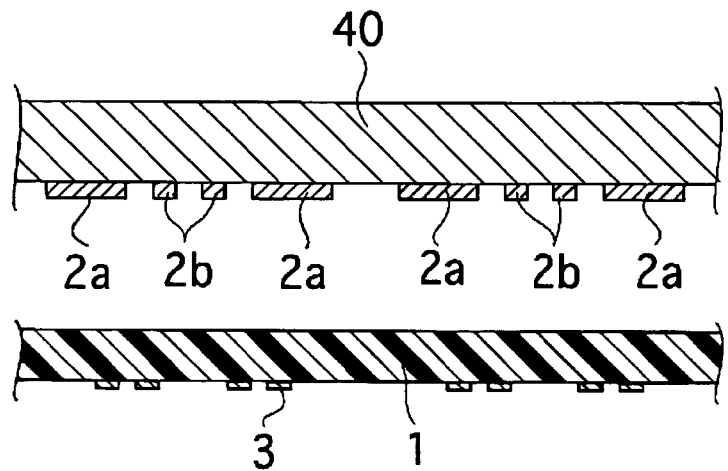
FIGS. 11A to 11C are diagrammatic cross-sectional views illustrating steps for planarization of a surface of a substrate in another modified example.
Figure 11B:
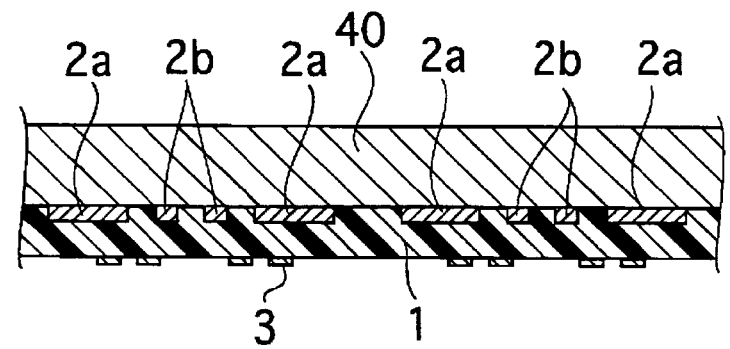
Figure 11C:
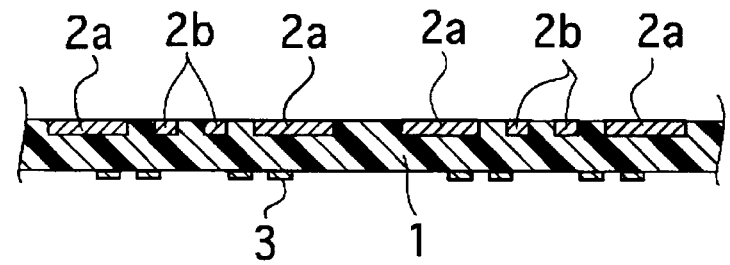

Alternatively, as shown in FIG. 11A, the conductor portions 2a, 2b are formed on the surface of the support 40 through a release layer (not shown), and the resultant material is bonded to the insulating layer 1 so that the conductor portions 2a, 2b are embedded in the insulating layer 1 (FIG. 11B) and then the support 40 is peeled off (FIG. 11C).

Finally, the embodiments and examples described above are only examples of the present invention. It should be noted that the present invention is not restricted only to such embodiments and examples, and various modifications, combinations and sub-combinations in accordance with its design or the like may be made without departing from the scope of the present invention.

What is claimed is:

1. A junction structure for conductive projection, comprising:
    a first insulating layer;
    a conductor portion formed on a surface of the first insulating layer;
    a conductive projection joined to a top surface of the conductor portion;
    a second insulating layer formed on the surface of the first insulating layer such that the second insulating layer surrounds the conductor portion and is in contact with the sides of the conductor portion, but does not contact the top surface of the conductor portion, the second insulating layer having a top surface that is formed at approximately the same level as the top surface of the conductor portion; and
    a resin material extending from the conductive projection to another conductive projection, a portion of the resin material surrounding a root portion of the conductive projection in a ring form, the resin material being of a different material than the second insulating material.

2. The junction structure for conductive projection according to claim 1, wherein said resin material which surrounds said root portion of said conductive projection is in a fillet form.

3. The junction structure for conductive projection according to claim 1, wherein said resin material contains an activator which assists the junction between said conductive projection and said conductor portion when said resin material is in an uncured state.

4. The junction structure for conductive projection according to claim 1, wherein said resin material has photocuring property.

5. The junction structure for conductive projection according to claim 1, wherein said conductive projection comprises a core portion and a conductive surface layer portion for covering the surface of said core portion.

6. A junction method for conductive projection, comprising the steps of:
    forming a first insulating layer;
    forming a conductor portion on a surface of the first insulating layer;
    forming a second insulating layer on the surface of the first insulating layer such that the second insulating layer surrounds the conductor portion and is in contact with the sides of the conductor portion, but does not contact the top surface of the conductor portion, the second insulating layer having a top surface that is formed approximately the same level as the top surface of the conductor portion; and
    supplying a resin material in an uncured state onto at least a junction plane of said conductor portion to which a conductive projection is joined, said resin material in an uncured state being supplied onto the entire surfaces of both of said conductor portion and said insulating layer;
    curing said supplied resin except for a portion of said resin on said junction plane; disposing said conductive projection on said junction plane, on which said resin material remains uncured; and
    heating said resin material and said conductive projection to join said conductive projection to said conductor portion while curing said previously uncured resin material so as that a root portion of said conductive projection is surrounded by said resin material in a ring form.

* * * * *